United States Patent

Carbaugh, Jr. et al.

[11] Patent Number: 5,974,931
[45] Date of Patent: Nov. 2, 1999

[54] FLEX DIE PUNCHING APPARATUS AND METHOD

[75] Inventors: William Dale Carbaugh, Jr., Greencastle, Pa.; Lester Wynn Herron, Hopewell Junction, N.Y.; Mark William Kapfhammer, Fishkill, N.Y.; Mark Joseph LaPlante, Walden, N.Y.; David Clifford Long, Wappingers Falls, N.Y.; Nabil Amir Rizk, Apex, N.C.; James Robert Wylder, Round Rock, Tex.

[73] Assignee: International Business Machines Corporation, Armonk, N.Y.

[21] Appl. No.: 08/889,038

[22] Filed: Jul. 7, 1997

Related U.S. Application Data

[63] Continuation of application No. 08/457,634, Jun. 1, 1995, abandoned.

[51] Int. Cl.[6] .................................. B26F 1/14; B26F 1/38
[52] U.S. Cl. ................................. 83/685; 83/175; 83/690; 83/698.91; 264/153
[58] Field of Search ............................ 83/175, 690, 685, 83/176, 698.91, 658; 72/55; 264/153

[56] References Cited

U.S. PATENT DOCUMENTS

| | | | |
|---|---|---|---|
| 1,894,641 | 1/1933 | Shaw | 83/175 |
| 2,133,445 | 10/1938 | Guerin | 83/21 |
| 2,351,475 | 6/1944 | Berger | 72/55 |
| 2,402,836 | 6/1946 | Nielsen | 72/55 |
| 2,966,872 | 1/1961 | Schmocker | 83/176 X |
| 3,091,986 | 6/1963 | Tracey et al. | 83/690 X |
| 3,167,985 | 2/1965 | Madsen | 83/145 |
| 3,256,764 | 6/1966 | Hardy | 83/690 |
| 3,396,620 | 8/1968 | Raphael et al. | 83/685 X |
| 3,683,735 | 8/1972 | Achler et al. | 83/374 |
| 3,803,963 | 4/1974 | Hunt | 83/175 X |
| 3,992,966 | 11/1976 | D'Agostino | 83/175 |
| 4,377,957 | 3/1983 | Wheeler | 83/685 X |
| 4,558,619 | 12/1985 | Caumont | 83/699.31 X |
| 4,856,393 | 8/1989 | Braddon | 83/685 X |
| 4,856,399 | 8/1989 | Deshet | 83/685 |
| 5,124,522 | 6/1992 | Booke et al. | 219/121.19 |
| 5,168,454 | 12/1992 | LaPlante et al. | 364/474.08 |

FOREIGN PATENT DOCUMENTS

| | | | |
|---|---|---|---|
| 2-139202 | 5/1990 | Japan. | |
| 570248 | 12/1975 | Switzerland | 83/685 |
| 1759503 A1 | 9/1992 | U.S.S.R. | 72/55 |

*Primary Examiner*—Rinaldi I. Rada
*Assistant Examiner*—Charles Goodman
*Attorney, Agent, or Firm*—Ira D. Blecker

[57] ABSTRACT

Disclosed is a flex die punching apparatus for forming an aperture in at least one sheet of material. There is a flexible, extrudable platen which, upon exertion of a force against it, extrudes at least a portion of at least one sheet of material through an aperture of a die. The flexible, extrudable platen may have a punch feature, corresponding to the shape and position of the die aperture, which assists in the extruding of the flexible, extrudable platen through the die aperture and also in the formation of the aperture in the sheet of material. In another embodiment of the invention, there may be a second die wherein the at least one sheet of material is placed between the first and second dies to form the aperture in the sheet of material.

18 Claims, 20 Drawing Sheets

FLEX DIE PUNCHING APPARATUS AND METHOD

The application is a continuation of application Ser. No. 08/457,634, filed Jun. 1, 1995, now abandoned.

BACKGROUND OF THE INVENTION

The present invention relates to an apparatus and method for machining features in sheets of material, and more particularly, relates to an apparatus and method which are simple in use and flexible in operation.

In the current manufacture of multilayer ceramic (MLC) substrates for integrated circuit semiconductor package structures, a plurality of ceramic sheets is formed by doctor blading a slurry containing a resin binder, a particulate ceramic material, solvents, and a plasticizer, drying the doctor bladed sheet, and blanking it into appropriate sized greensheets. Via holes are then mechanically punched for forming electrical interconnections through the sheet. Holes may also be punched in the greensheets to form cavities which will eventually hold the integrated circuit semiconductor device. Electrically conductive paste is deposited in the holes, and in appropriate patterns on the surface of the greensheets, the greensheets stacked and laminated, and the assembly subsequently fired at an appropriate sintering temperature.

There are several methods of forming the cavities in the greensheets. One of these is custom machined punch and die sets. While this method is advantageous for manufacturing large numbers of parts, the machined punch and die sets are expensive and require long lead times. In addition, this method is inflexible for manufacturing new cavity designs or moderate numbers of parts.

Another method for forming cavities is an energy beam system such as the electron beam system disclosed in Booke et al. U.S. Pat. No. 5,124,522, the disclosure of which is incorporated by reference herein. Here an electron beam is utilized to machine features in a greensheet. These kinds of systems can easily handle design changes but they involve large capital expenses and long process times. Also of interest is the scanning laser drilling system disclosed in LaPlante et al. U.S. Pat. No. 5,168,454, the disclosure of which is incorporated by reference herein. Again, the laser drilling system has great flexibility but is expensive and throughput of the system is a concern.

It would be desirable to have a system that is more flexible, simpler and less expensive to form cavities.

Kumagai Japanese Published Patent Application JP02-139202, the disclosure of which is incorporated by reference herein, discloses a system for punching holes in a greensheet which consists of a bottom plate, die, silicone rubber platen and ram. When a greensheet is placed between the die and platen, and force is applied by the ram, the platen forces portions of the greensheet into the apertures of the die. The platen itself is eventually extruded into the apertures of the die, thereby displacing the portions of the greensheet and forming holes or apertures in the greensheet. While this system is effective, it is not without its problems. For example, rounding of the greensheets at the holes occurs, i.e., sharp holes are not formed. This rounding is made even worse when thicker greensheets are utilized.

Deshet U.S. Pat. No. 4,856,399, the disclosure of which is incorporated by reference herein, discloses an apparatus very similar to Kumagai above. Deshet, in addition, discloses that the surface of the platen facing the die is heterogeneous in nature, containing localized regions of higher hardness than surrounding areas of the platen. The localized regions of higher hardness aid in the forming of holes with sharper corners in thin sheets. The thin sheets may be metallic or nonmetallic. It is apparent that the sharpness of the holes would depend on the location of the localized regions of higher hardness. In addition, Deshet would still have problems with thicker sheets of material.

Thus, there still remains a need for a punching apparatus and method which are simple in use and flexible in operation that could produce sharp apertures in sheets of material.

Accordingly, it is a purpose of the present invention to have a punching apparatus and method which are simple in use and flexible in operation for making apertures in sheets of material.

It is another purpose of the invention to have a punching apparatus and method for making sharp-cornered apertures in sheets of material.

It is yet another purpose of the invention to have a punching apparatus and method for making sharp-cornered apertures in thin and thick sheets of materials.

These and other purposes of the invention will become more apparent after referring to the following description of the invention considered in conjunction with the accompanying drawings.

BRIEF SUMMARY OF THE INVENTION

The purposes of the invention have been achieved by providing, according to a first aspect of the invention, a flex die punching apparatus comprising:

a first plate;

a die having at least one aperture positioned adjacent to the first plate;

a flexible, extrudable platen positioned adjacent to the at least one aperture of the die and adjacent to at least a portion of the remainder of the die, the flexible, extrudable platen having at least one punch feature corresponding to the shape and position of the at least one aperture of the die; and a second plate positioned adjacent to the flexible, extrudable platen;

wherein, in operation, when at least one sheet workpiece is interposed between the flexible, extrudable platen and the die and then the first and second plates are forced together, the at least one punch feature of the flexible, extrudable platen is caused to extrude a portion of the at least one sheet workpiece through the at least one aperture of the die, thereby forming at least one sheet workpiece having at least one aperture corresponding to the shape and position of the at least one aperture of the die.

According to a second aspect of the invention there is provided a flex die punching apparatus comprising:

a first plate;

a first die having at least one aperture positioned adjacent to the first plate;

a second die having at least one aperture positioned adjacent to the first die, the at least one aperture in the first and second dies being in alignment;

a flexible, extrudable platen positioned adjacent to the at least one aperture of the second die and adjacent to at least a portion of the remainder of the second die; and a second plate positioned adjacent to the flexible, extrudable platen;

wherein, in operation, when at least one sheet workpiece is interposed between the first and second dies and then the first and second plates are forced together, the flexible, extrudable platen is caused to extrude a portion of the at least sheet workpiece through the at least one aperture of the first die, thereby forming at least sheet workpiece having at least one aperture corresponding to the shape and position of the at least one aperture of the first die.

According to a third aspect of the invention, there is provided a method of forming at least one aperture in at least one sheet of material utilizing a flex die punching apparatus, the apparatus having a first plate, a die having at least one aperture positioned adjacent to the first plate, a flexible, extrudable platen positioned adjacent to the at least one aperture of the die and adjacent to at least a portion of the remainder of the die, the flexible, extrudable platen having at least one punch feature corresponding to the shape and position of the at least one aperture of the die, and a second plate positioned adjacent to the flexible, extrudable platen, the method comprising the steps of:

placing at least one sheet of material between the flexible, extrudable platen and the die; and forcing the first and second plates together, the at least one punch feature of the flexible, extrudable platen being caused by the step of forcing to extrude a portion of the at least one sheet of material through the at least one aperture of the die, thereby forming the at least one sheet of material having at least one aperture corresponding to the shape of the at least one aperture of the die.

According to a final aspect of the invention, there is provided a method of forming at least one aperture in at least one sheet of material utilizing a flex die punching apparatus, the apparatus having a first plate, a first die having at least one aperture positioned adjacent to the first plate, a second die having at least one aperture positioned adjacent to the first die, the at least one aperture in the first and second dies being in alignment, a flexible, extrudable platen positioned adjacent to the at least one aperture of the second die and adjacent to at least a portion of the remainder of the second die, and a second plate positioned adjacent to the flexible, extrudable platen, the method comprising the steps of:

placing a first sheet of material between the first and second dies;

forcing the first and second plates together, the extrudable platen being caused by the step of forcing to extrude a portion of the first sheet of material through the at least one aperture of the first die, thereby forming the first sheet of material having at least one aperture corresponding to the shape of the at least one aperture of the first die.

BRIEF DESCRIPTION OF THE DRAWINGS

FIG. 3A is a plan view of the punch feature of FIG. 1 while

DETAILED DESCRIPTION OF THE INVENTION

Figure 1A:
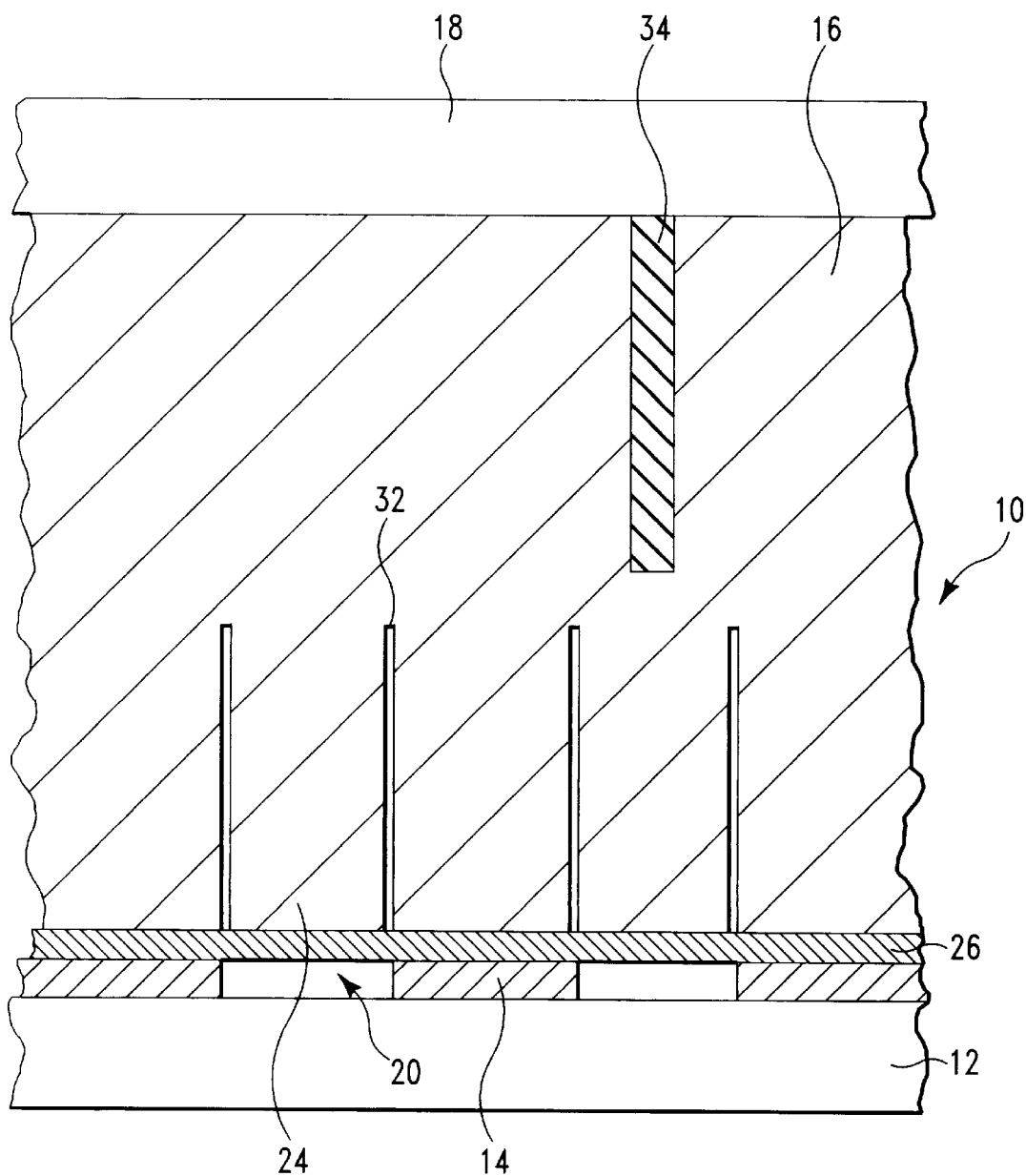
FIGS. 1A and 1B are schematical cross-sections of the apparatus according to the present invention showing a punch feature and stiffening material in the platen.
Figure 1B:
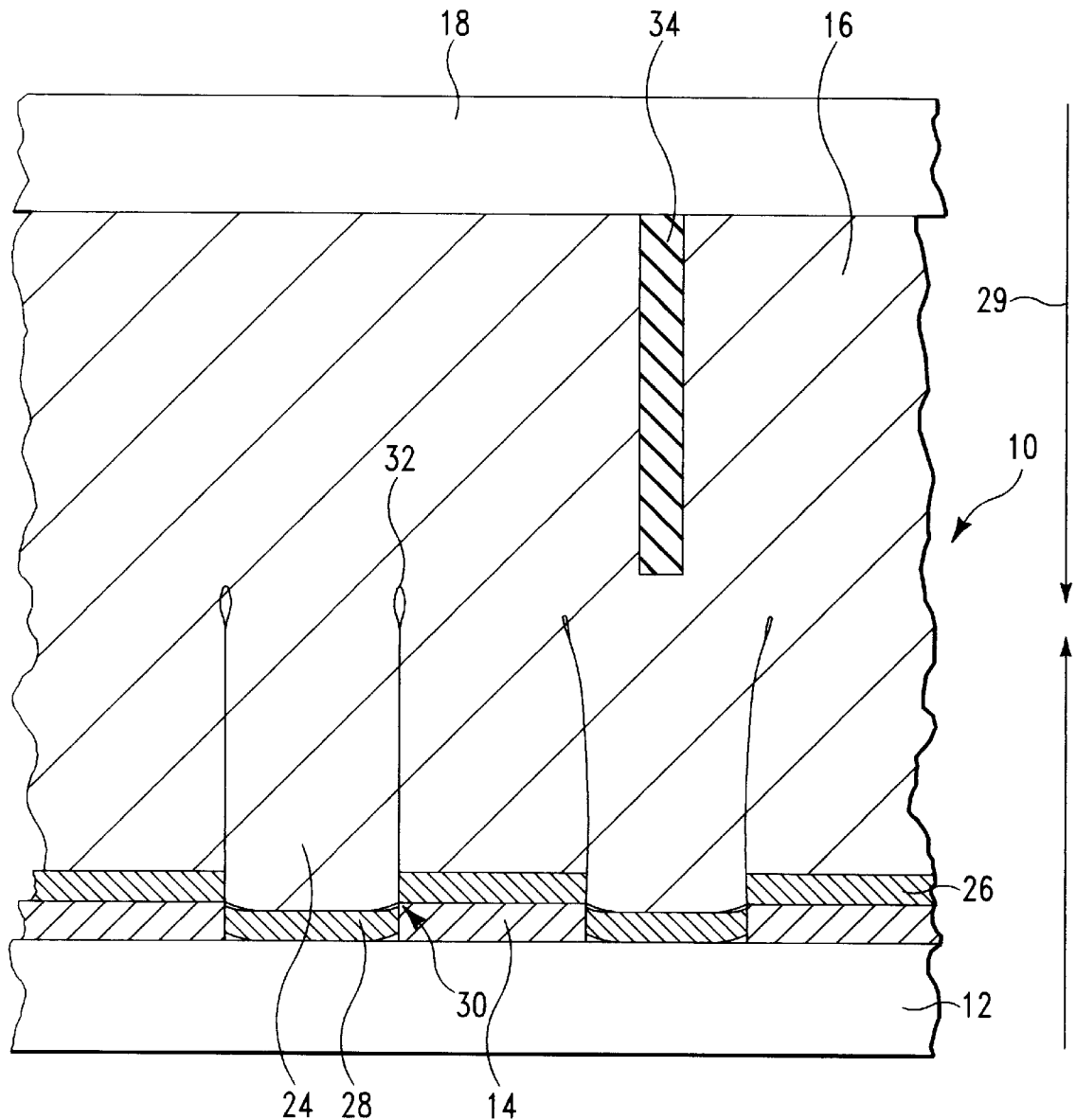

Referring now to the Figures in more detail, where like numbers have been used to refer to like features, and particularly referring to FIGS. 1A and 1B, there is disclosed according to the invention a flex die punching apparatus 10. The flex die punching apparatus 10 comprises a first plate 12, a die 14 positioned adjacent to the first plate 12, a flexible, extrudable platen 16, and a second plate 18 positioned adjacent to the flexible, extrudable platen. The die 14 has at least one hole or perforation or aperture (hereafter just aperture) 20.

As shown in the Figures, the die has two apertures but it should be understood that there may more or less than two apertures, depending on the use to which the invention is put.

Figure 9:
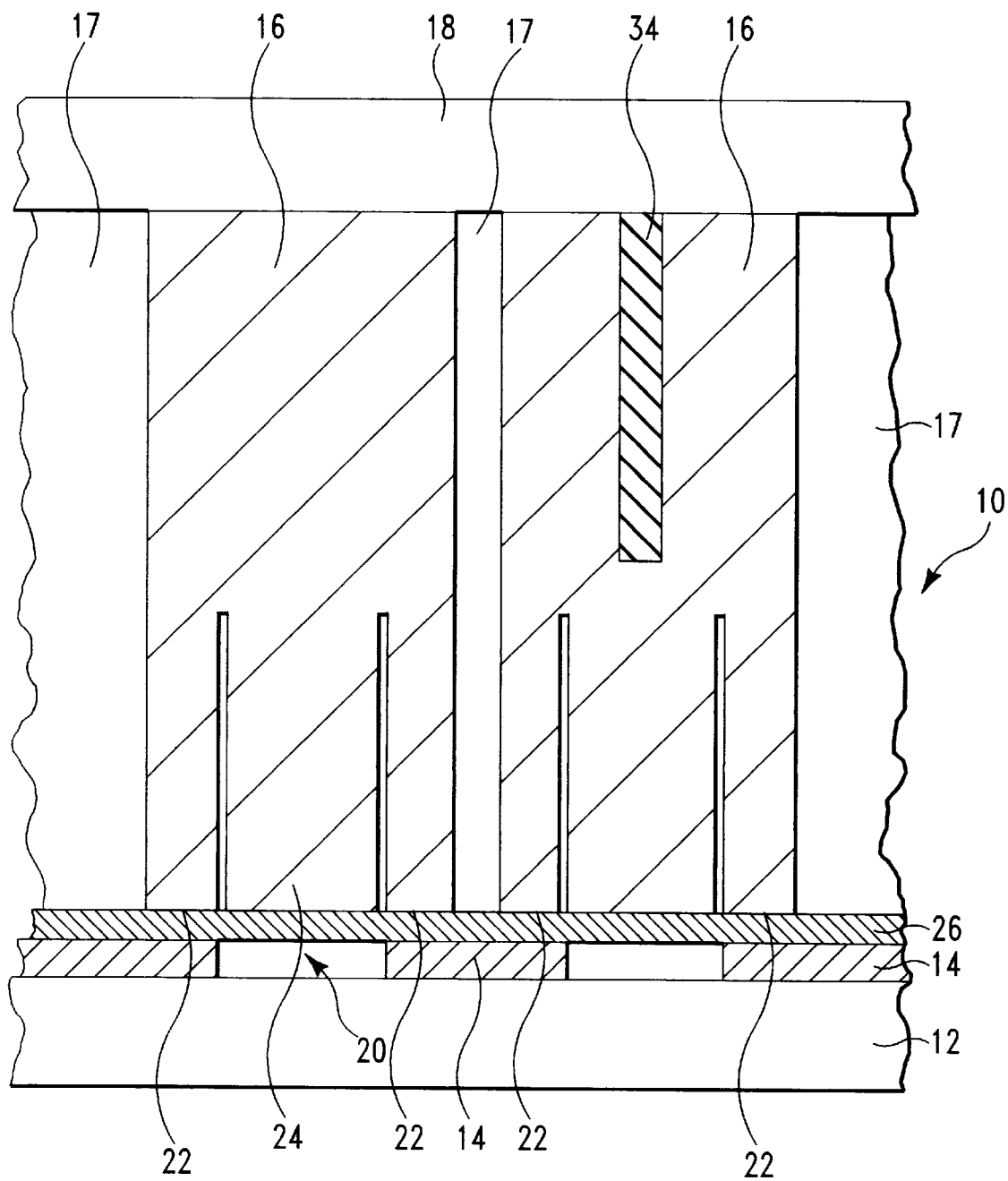
FIG. 9 is a schematical cross-section of the apparatus according to the present invention similar to FIG. 1A but modified to show the flexible, extrudable platen only extending partially across the surface of the die.

While the flexible, extrudable platen 16 is shown extending across the whole surface of the die 14, the flexible, extrudable platen 16 may, in fact, only cover part of the die surface. FIG. 9 shows the flex die apparatus 10 of FIG. 1 except that the flexible, extrudable platen 16 does not extend across the whole surface of the die 14. Voids or areas 17 represent space which is not occupied by platen 16. That is, the flexible, extrudable platen 16 is positioned so that it is adjacent to the aperture 20 of the die 14 and also adjacent to at least a portion of the remainder of the surface 22 of the die 14. The advantages to this particular embodiment of the flexible, extrudable platen 16 will become more apparent hereafter.

An important element of the flexible, extrudable platen 16 is punch feature 24 corresponding to the shape and position of the aperture 20 of the die 14. In general, punch feature 24 should be about the same size and shape of aperture 20 since punch feature 24 will be extruded through aperture 20 during operation of the flex die punching apparatus 10. Punch feature 24 in flexible, extrudable platen 16 is distinct from the remainder of the surface of the flexible, extrudable platen as shown in FIG. 1A. The punch feature 24 will be further discussed in more detail hereafter.

Figure 11:
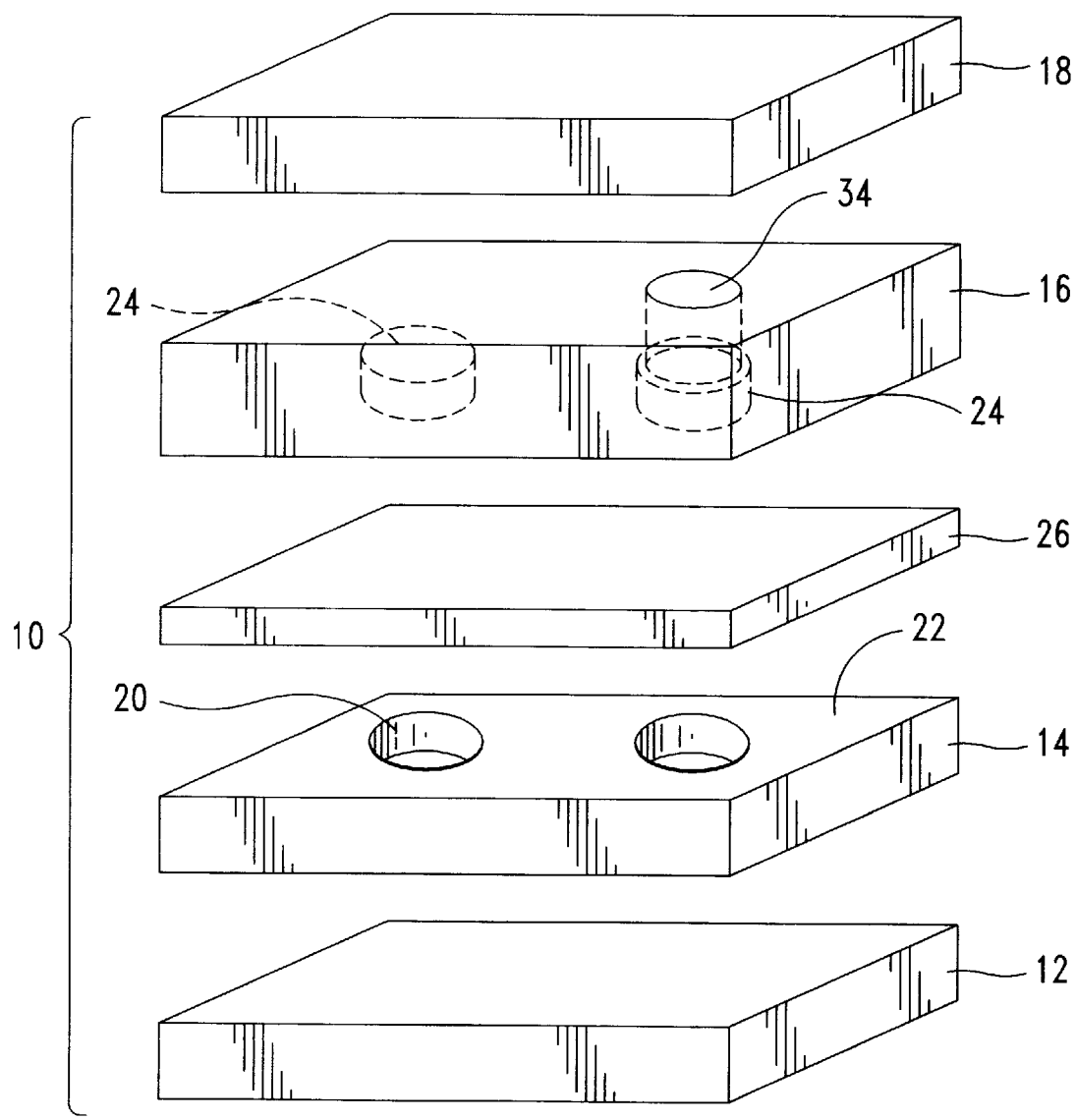
FIG. 11 is an exploded perspective view of the apparatus of FIG. 1 according to the present invention.

The relationship of the different parts of the invention can be seen more clearly by reference to FIG. 11 wherein the flex die punching apparatus 10 is shown by an exploded view.

Referring back to FIGS. 1A and 1B, in operation, at least one sheet workpiece 26 would be placed between die 14 and flexible, extrudable platen 16. Thereafter, first plate 12 would be forced against second plate 18 as indicated by arrows 29 to begin compressing the flexible, extrudable platen 16. This may be accomplished by making one of the first and second plates 12, 18 stationary and moving the other of the first and second plates 12, 18 towards the one. Alternatively, both the first and second plates 12, 18 may be made movable, in which case they would move towards each other. Whether the first plate 12 or the second plate 18 is stationary or neither of them is stationary is unimportant to the invention.

During operation of the flex die punching apparatus 10, the flexible, extrudable platen 16, particularly punch feature 24, is allowed to extrude through aperture 20 of the die 14. As a consequence, flexible, extrudable platen 16 causes portion 28 of the sheet workpiece 26 to be removed from the remainder of the sheet workpiece 26, thereby forming a sheet workpiece 26 having an aperture 30. Aperture 30 will have a shape and position corresponding to the shape and position of aperture 20 of die 14. Die 14 should be at least as thick as, and preferably thicker than, sheet workpiece 26 so as to accommodate portion 28 without interfering with the formation of aperture 30 of sheet workpiece 26. The relative thickness of die 14 will generally be true of all of the embodiments of the present invention except the embodiment of FIGS. 8A and 8B.

Figure 3A:
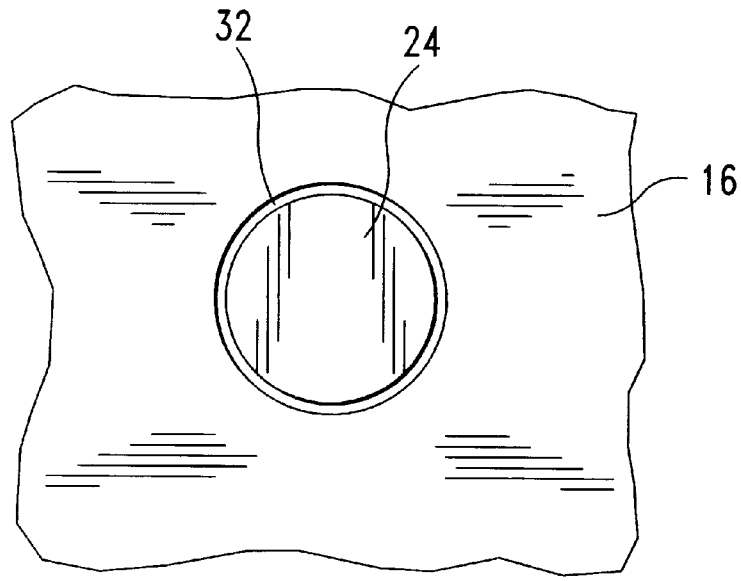
Figure 3B:
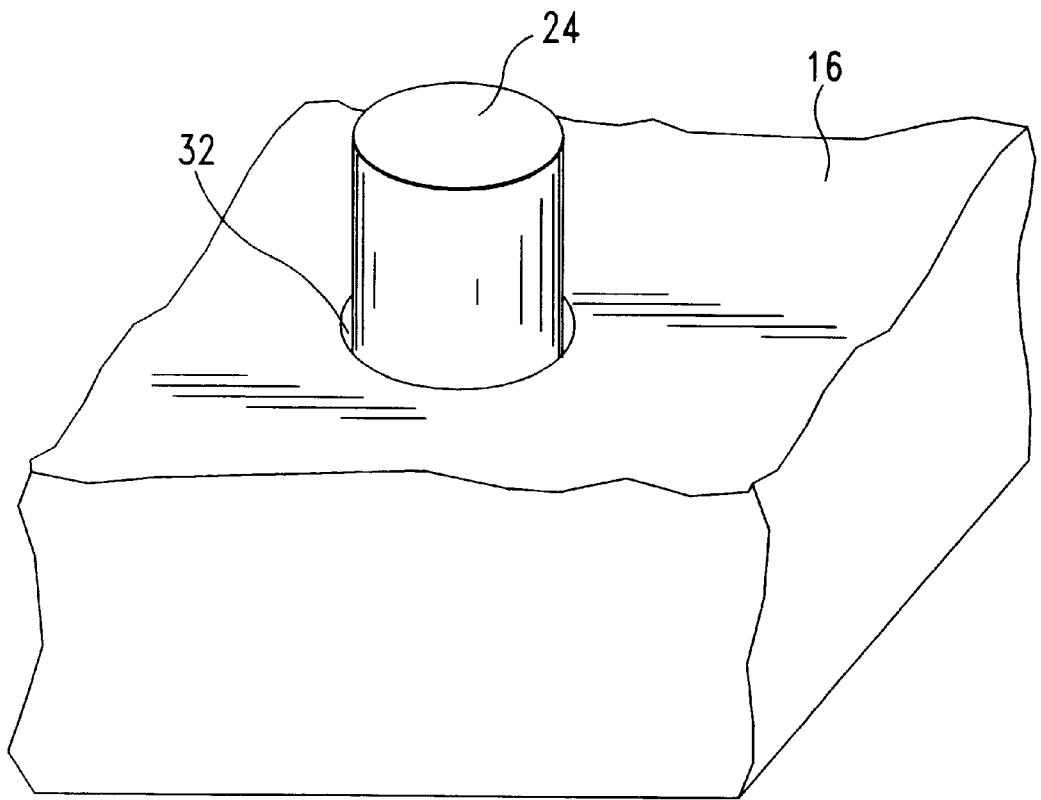
FIG. 3B is a perspective view showing the punch feature as it would protrude from the platen during the punching operation.

Punch feature 24 is shown in more detail in FIGS. 3A and 3B. In the plan view of FIG. 1A, defined feature 24 is shown as being circular in shape which would correspond to a circular shape of aperture 20 in die 14. It is assumed that an aperture with a circular shape is desired. With the teachings of the present invention, any shape may be used for punch feature 24 and aperture 20. As best seen in FIG. 1A, there is a gap 32 between punch feature 24 and flexible, extrudable platen 16. Gap 32 is present as a result of the way punch feature 24 is formed. For example, a circular shape may be laser drilled in the flexible, extrudable platen 16 by laser drilling around the periphery of the desired shape. If laser drilling is used, the method and apparatus disclosed in the above LaPlante U.S. Pat. No. 5,168,454 is preferred. During laser drilling, it is important to only partially perforate the flexible, extrudable platen 16 so that gap 32 is formed, resulting in the formation of punch feature 24. In operation, punch feature 24 protrudes from flexible, extrudable platen 16, as shown in FIGS. 1B and 3B. Since punch feature 24 is close in shape, dimension and position to desired aperture 30 in sheet workpiece 26, aperture 30 will have sharp, clean edges.

As discussed earlier, flexible, extrudable platen 16 may only partially cover die 14, as shown in FIG. 9. The advantage to this embodiment of the invention is that less force is needed to extrude flexible, extrudable platen 16 through aperture 20 of die 14.

Referring again to FIGS. 1A and 1B, another element of the invention is illustrated. Flexible, extrudable platen 16 may also comprise a stiffening material 34 inserted into the punch feature 24. The stiffening material 34 is stiffer than the flexible, extrudable platen 16. Due to the stiffening material 34, the forces generated due to the moving together of the first plate 12 and the second plate 18 can be more easily translated to punch feature 24, thereby more easily accomplishing the forming of aperture 30 in sheet workpiece 26.

Figure 2A:
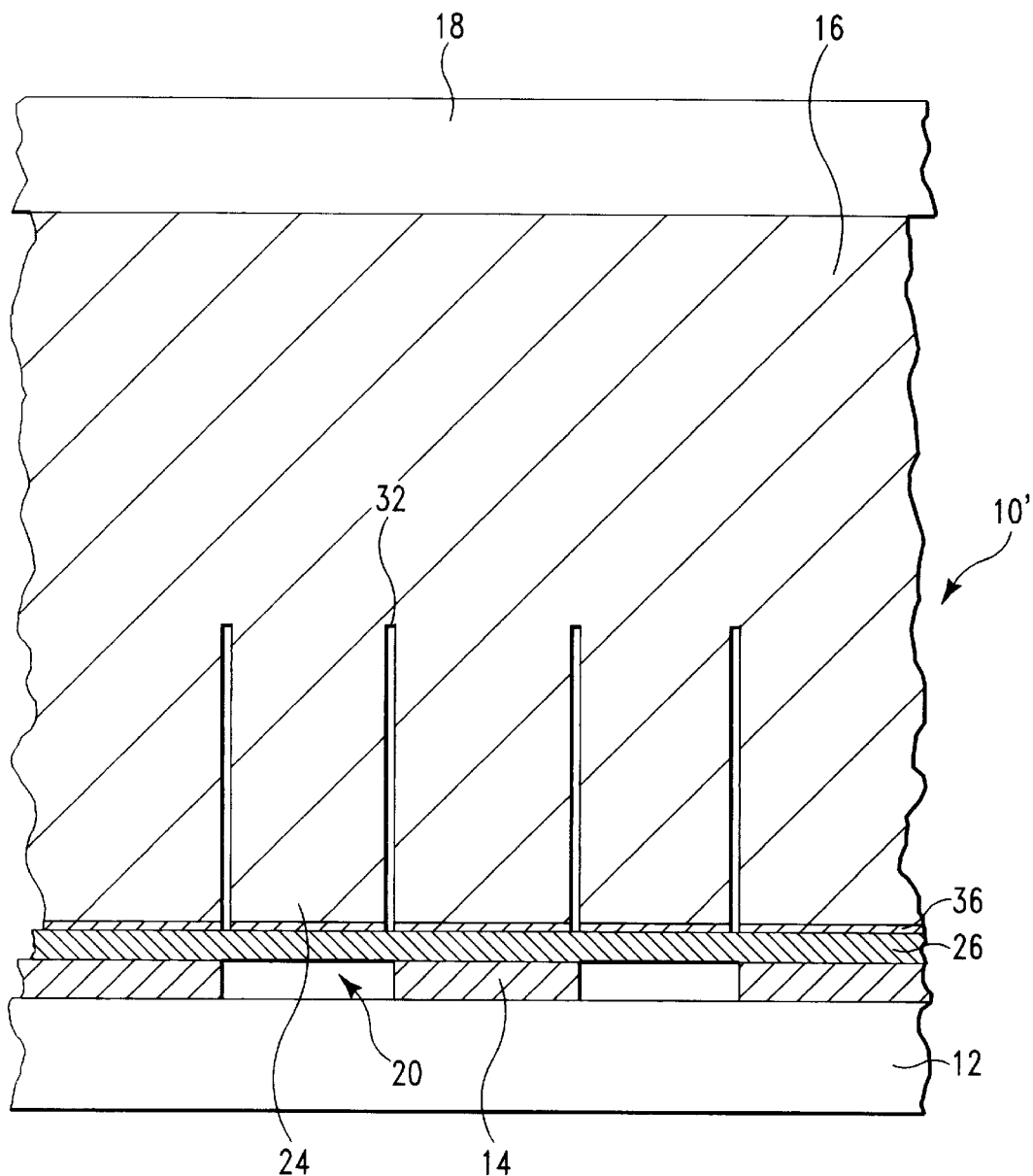
FIGS. 2A and 2B are schematical cross-sections of the apparatus according to the present invention showing a thin, hard layer of material on the platen.
Figure 2B:
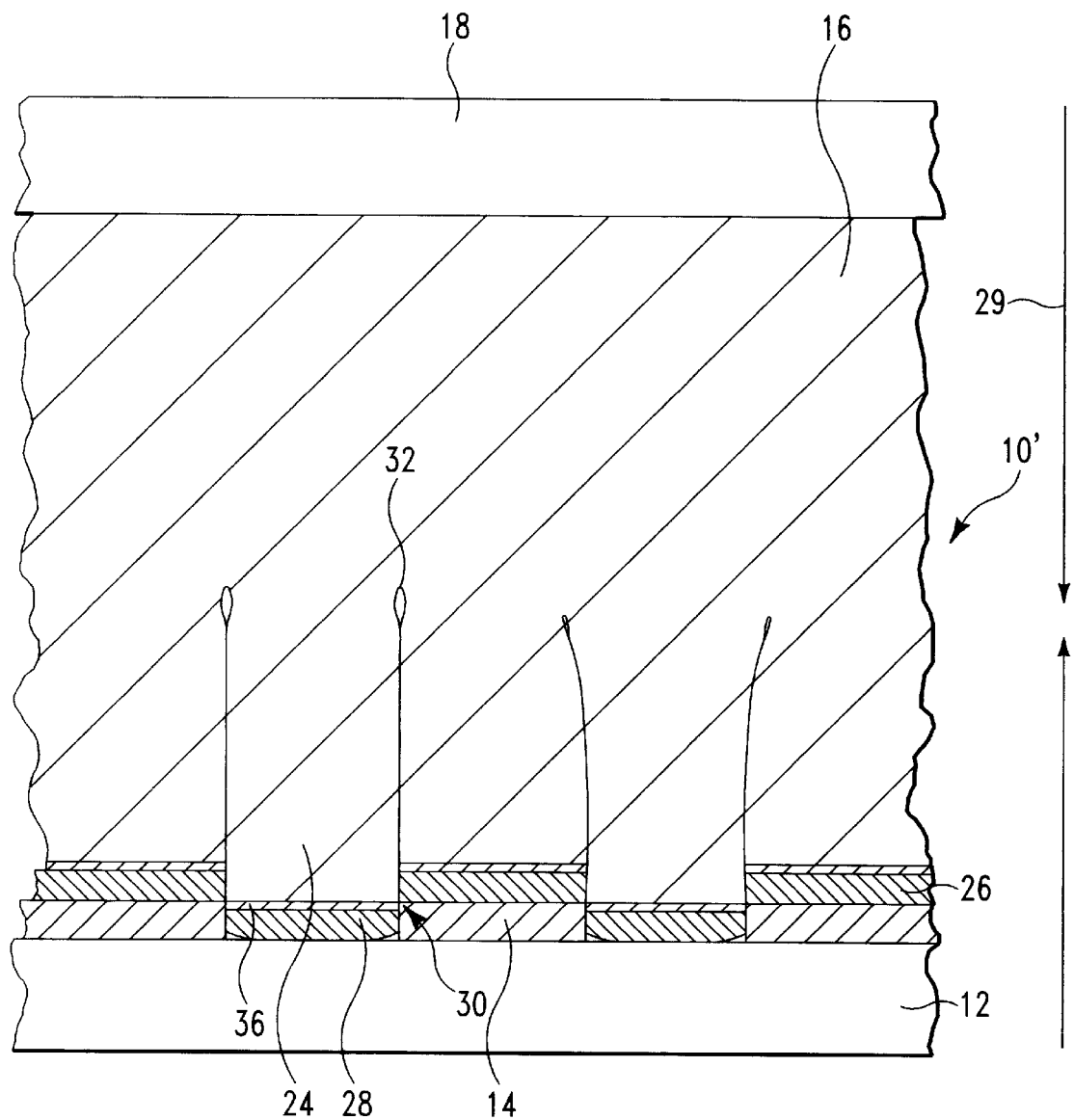

Now referring to FIGS. 2A and 2B, there is disclosed another embodiment according to the present invention. Flex die punching apparatus 10' of FIGS. 2A and 2B is identical to flex die punching apparatus of FIGS. 1A and 1B except that now flexible, extrudable platen 16 includes a thin, hard layer of material 36 uniformly deposited on the surface of the flexible, extrudable platen 16 that faces the die 14. The thin, hard layer of material 36 is bonded to that part of the flexible, extrudable platen 16 that is adjacent to the die 14 and is also bonded to the punch feature 24. The thin, hard layer of material 36 may be selected from the following group of materials: ceramics (e.g., boron nitride, alumina, aluminum nitride, titanium nitride, etc.), metals and composites (e.g., hard particles in a binder such as diamond in epoxy). It is believed that the thin, hard layer of material 36 will assist in achieving the formation of apertures 30 with sharp corners in the sheet workpiece.

Figure 4A:
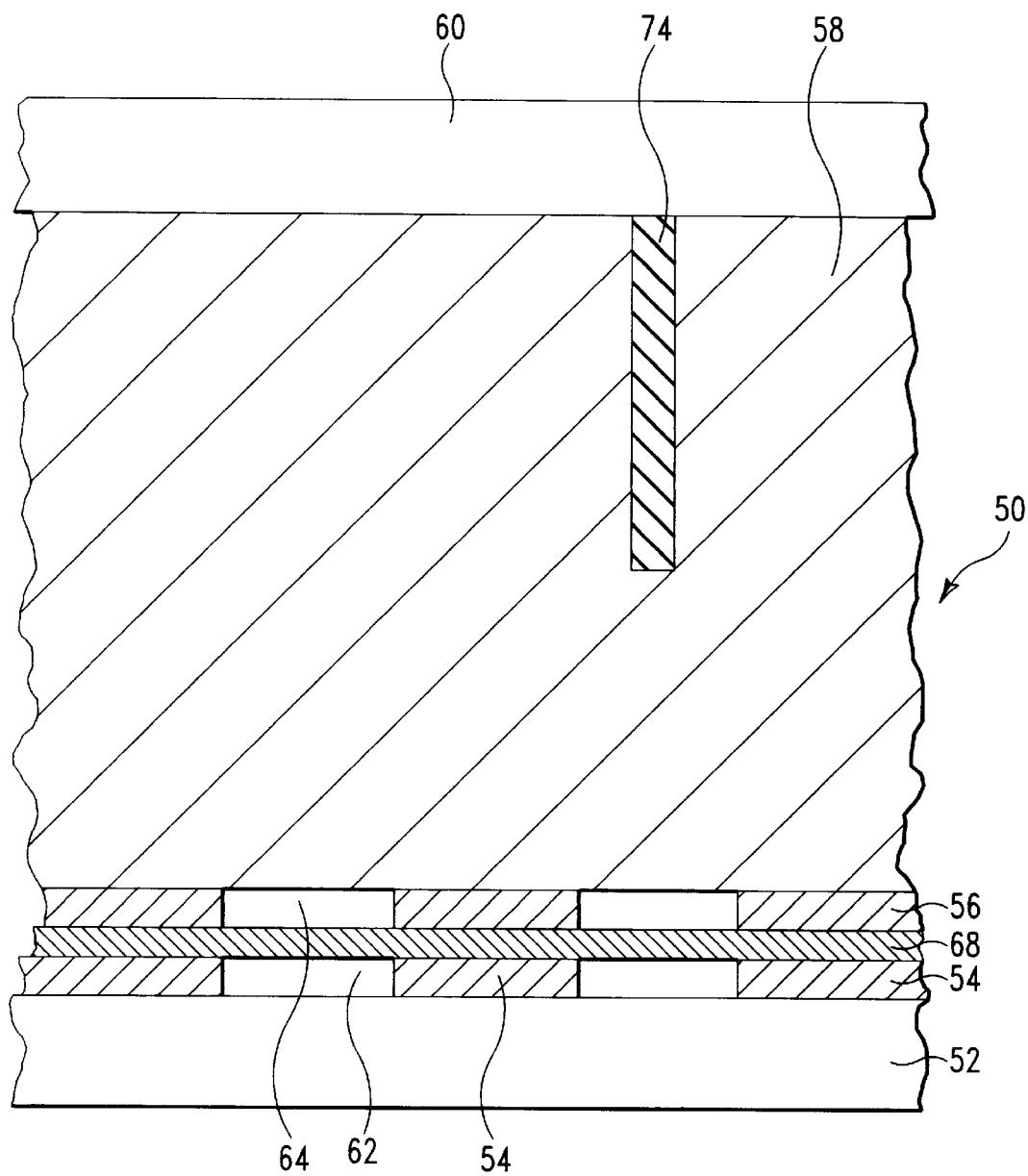
FIGS. 4A and 4B are schematical cross-sections of the apparatus according to the present invention showing a second die and further showing stiffening material in the platen.
Figure 4B:
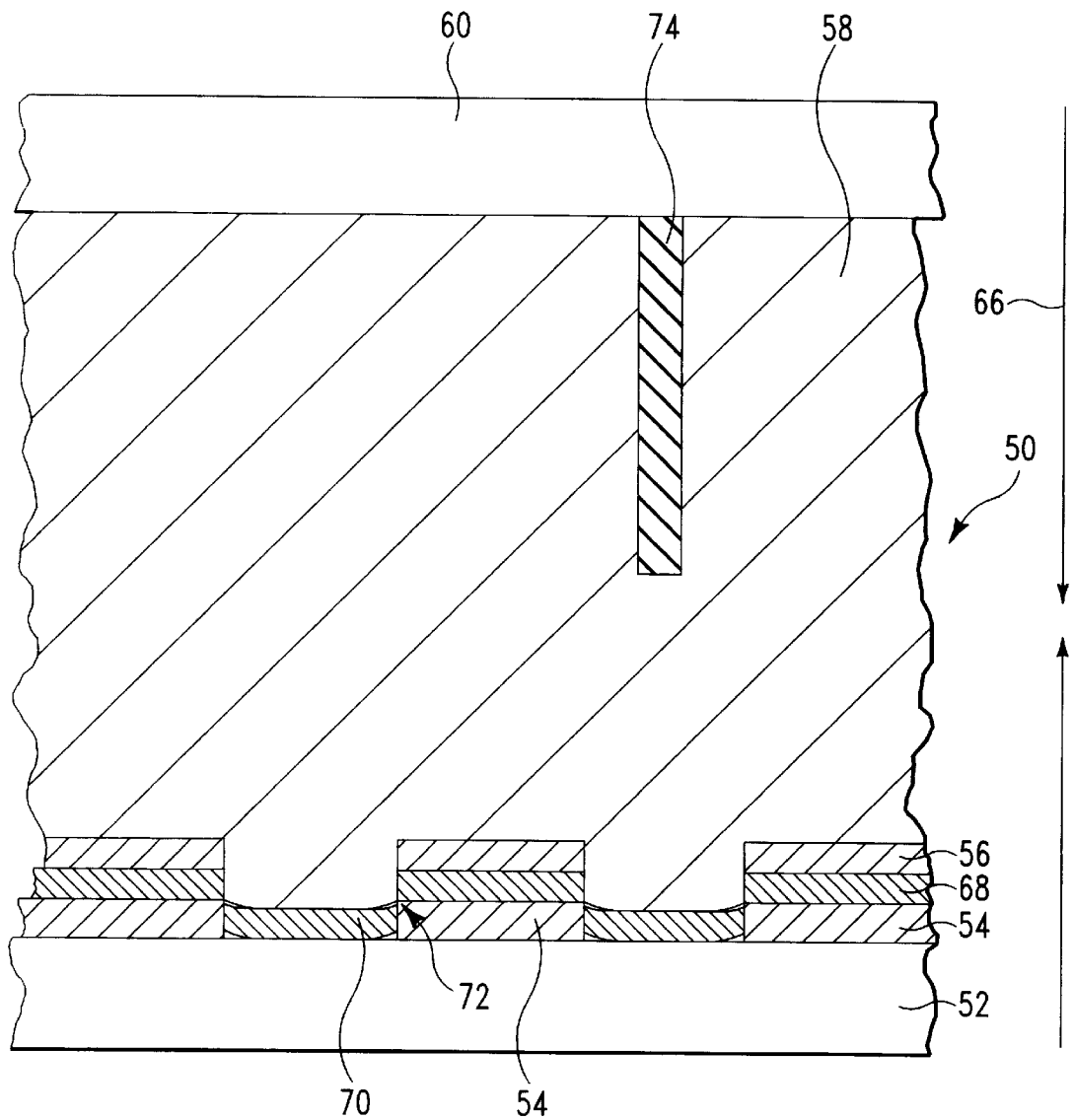

A further embodiment of the invention is illustrated in FIGS. 4A and 4B. The flex die punching apparatus 50 comprises a first plate 52, a first die 54 positioned adjacent to the first plate 52, a second die 56 positioned adjacent to the first die 54, a flexible, extrudable platen 58 positioned adjacent to the second die 56 and a second plate 60 positioned adjacent to the flexible, extrudable platen 58. Each of first die 54 and second die 56 has at least one aperture 62, 64, respectively. Aperture 62 of first die 54 should be in alignment with aperture 64 of second die 56.

Figure 10:
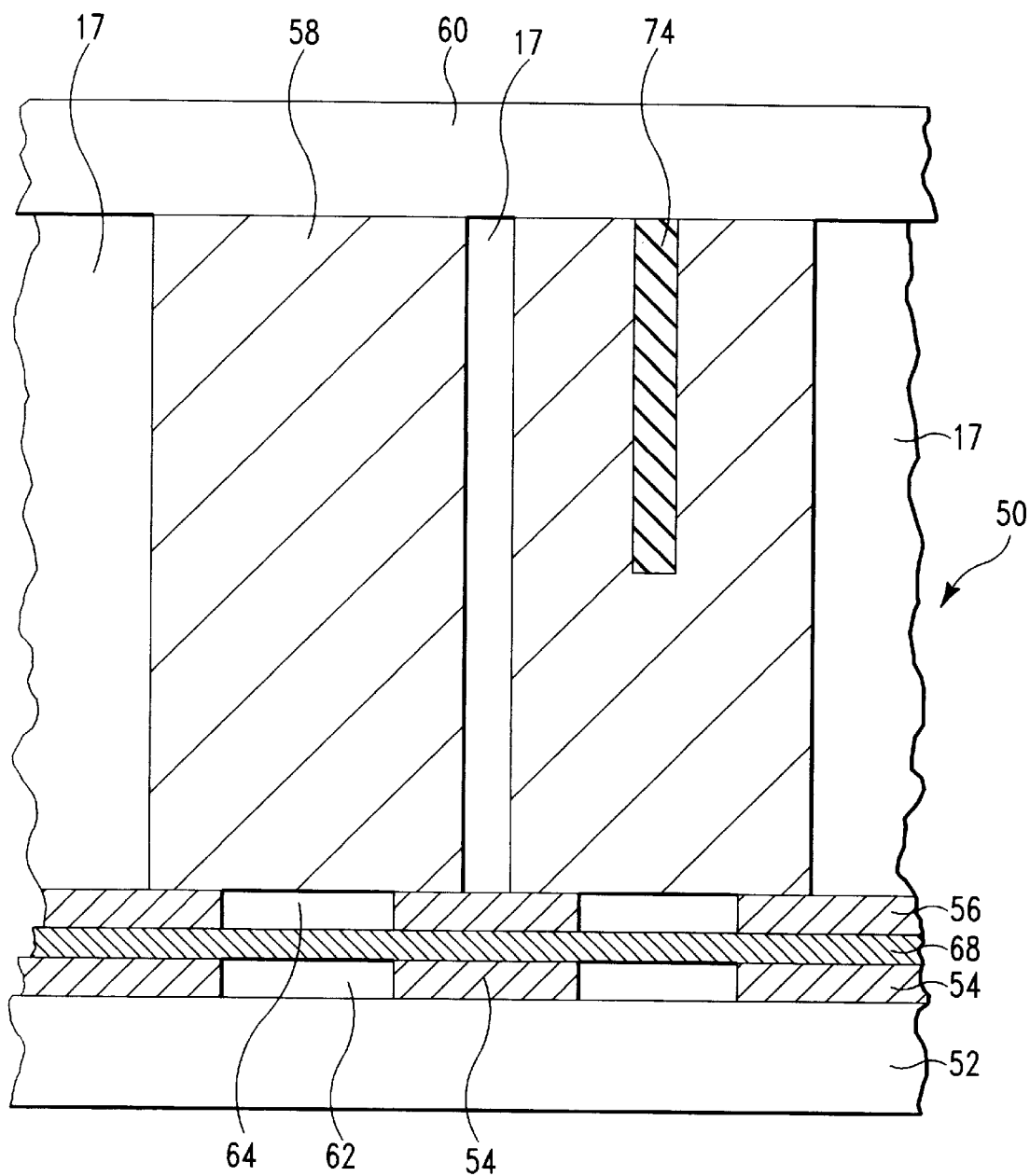
FIG. 10 is a schematical cross-section of the apparatus according to the present invention similar to FIG. 4A but modified to show the flexible, extrudable platen only extending partially across the surface of the die.

As noted earlier, flexible, extrudable platen 58 need not extend across the entire surface of second die 56. However, it must extend across (or be adjacent to) aperture 64 and at least a portion of the second die 56, as shown in FIG. 10. As before, reducing the cross-sectional area of the flexible, extrudable platen 58 reduces the amount of force necessary to extrude the flexible, extrudable platen 58 into the apertures 62, 64 of first and second dies 54, 56, respectively.

In operation, at least one sheet workpiece 68 would be placed between first die 54 and second die 56. Thereafter, first plate 52 would be forced against second plate 60 as indicated by arrows 66 to begin compressing the flexible, extrudable platen 60. This may be accomplished by making one of the first and second plates 52, 60 stationary and moving the other of the first and second plates 52, 60 towards the one. Alternatively, both the first and second plates 52, 60 may be made movable, in which case they would move towards each other.

During operation of the flex die punching apparatus 50, as more clearly illustrated in FIG. 4B, the flexible, extrudable platen 58 is allowed to extrude through aperture 64 of second die 56 and then aperture 62 of first die 54. As a consequence, flexible, extrudable platen 58 causes portion 70 of the sheet workpiece 68 to be removed from the remainder of the sheet workpiece 68 and transported through aperture 62 of first die 54, thereby forming a sheet workpiece 68 having an aperture 72. The resulting sheet workpiece 68 has at least one aperture 72 that corresponds to the shape and position of the aperture 62 of the first die 54.

The addition of second die 56 provides several important advantages to the invention. One is that thicker sheets may be punched. Another is that the apertures formed are clean and sharp, thereby forming a superior aperture. A further advantage is that multiple sheets may be more easily punched.

In another embodiment of the invention, as also illustrated in FIGS. 4A, 4B, 5A and 5B, the flexible, extrudable platen 58 may also comprise a stiffening material 74 inserted into the flexible, extrudable platen 58. Where there is a punch feature, such as punch feature 76 of flex die punching apparatus 50' of FIGS. 5A and 5B, the stiffening material should be located within the punch feature. On the other hand, where there is no punch feature, the stiffening material 74 should be located directly adjacent to the aperture 64 of the second die 56 as shown in FIGS. 4A and 4B. The stiffening material 74 is stiffer than the flexible, extrudable platen 58. Due to the stiffening material 74, the forces generated due to the moving together of the first plate 52 and the second plate 60 can be more easily translated through the flexible, extrudable platen 58, thereby more easily accomplishing the forming of the aperture 72 in the sheet workpiece 68.

Figure 5A:
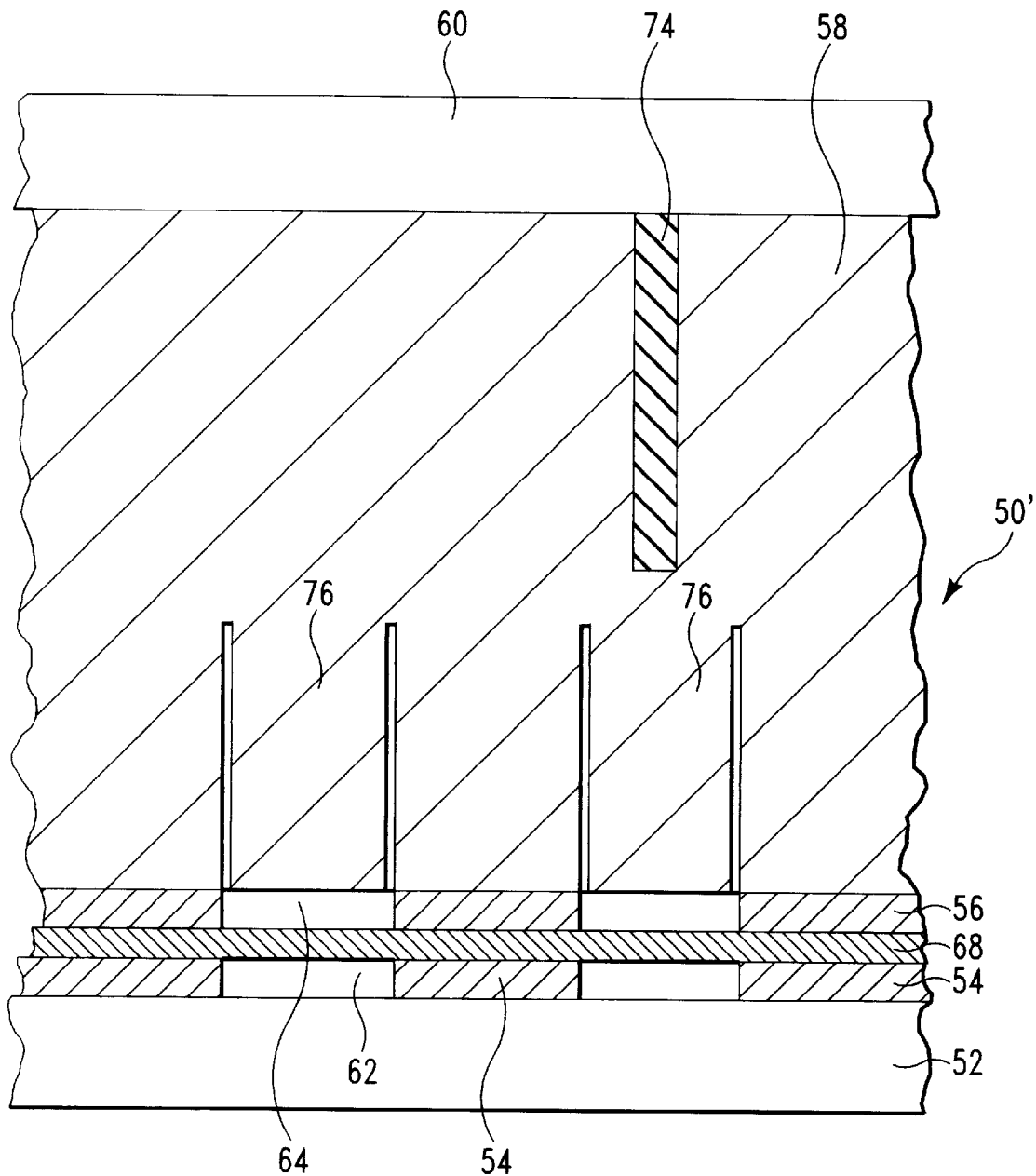
FIGS. 5A and 5B are schematical cross-sections of the apparatus according to the present invention showing a second die and further showing a punch feature and stiffening material in the platen.
Figure 5B:
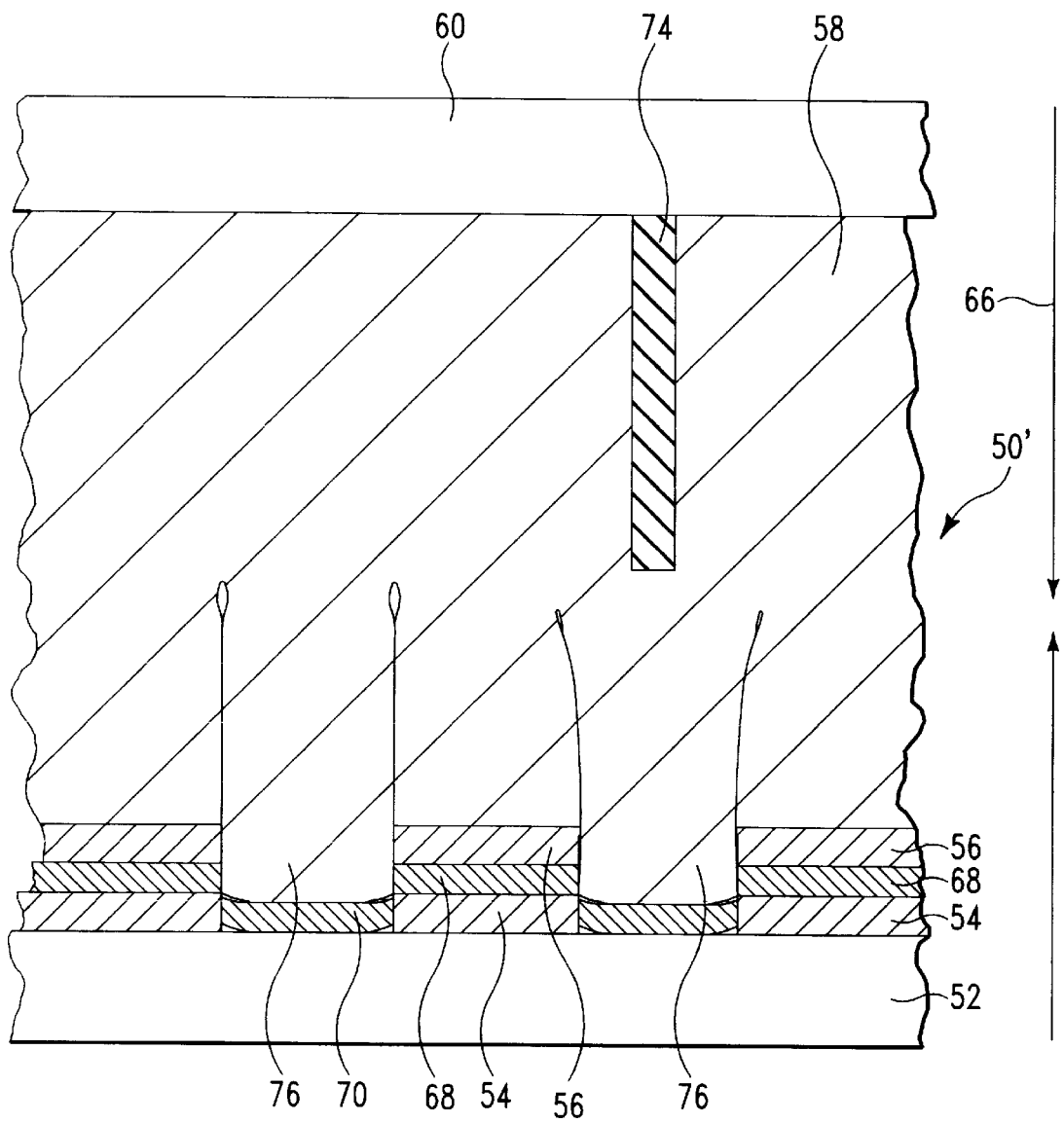

A further embodiment of the invention is illustrated in FIGS. 5A and 5B. The flex die punching apparatus 50' is identical to the flex die punching apparatus 50 of FIGS. 4A and 4B except that now flexible, extrudable platen 58 includes punch feature 76 therein. Punch feature 76 should, in general, correspond to the shape and position of the aperture 64 of the second die 56 and aperture 62 of the first die 54. Punch feature 76 should be about the same size and shape of the apertures 62, 64 since punch feature 76 will be extruded through apertures 62, 64 during operation of the flex die punching apparatus 50'. As noted previously with respect to the embodiment of FIGS. 1A and 1B, punch feature 76 in flexible, extrudable platen 58 is distinct from the remainder of the surface of the flexible, extrudable platen 58.

Figure 6A:
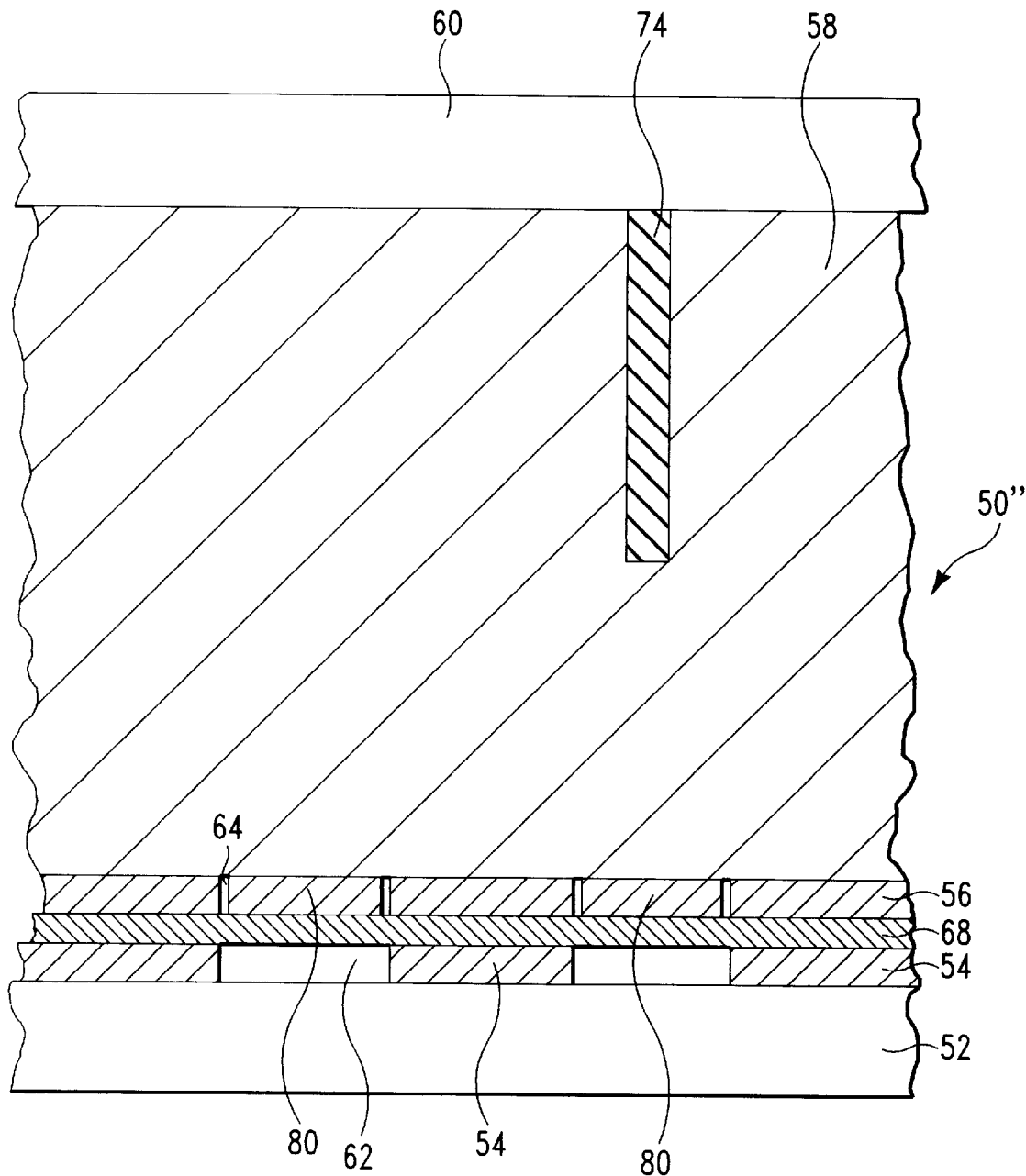
FIGS. 6A and 6B are schematical cross-sections of the apparatus according to the present invention showing a second die and further showing a punch feature on the platen and stiffening material in the platen.
Figure 6B:
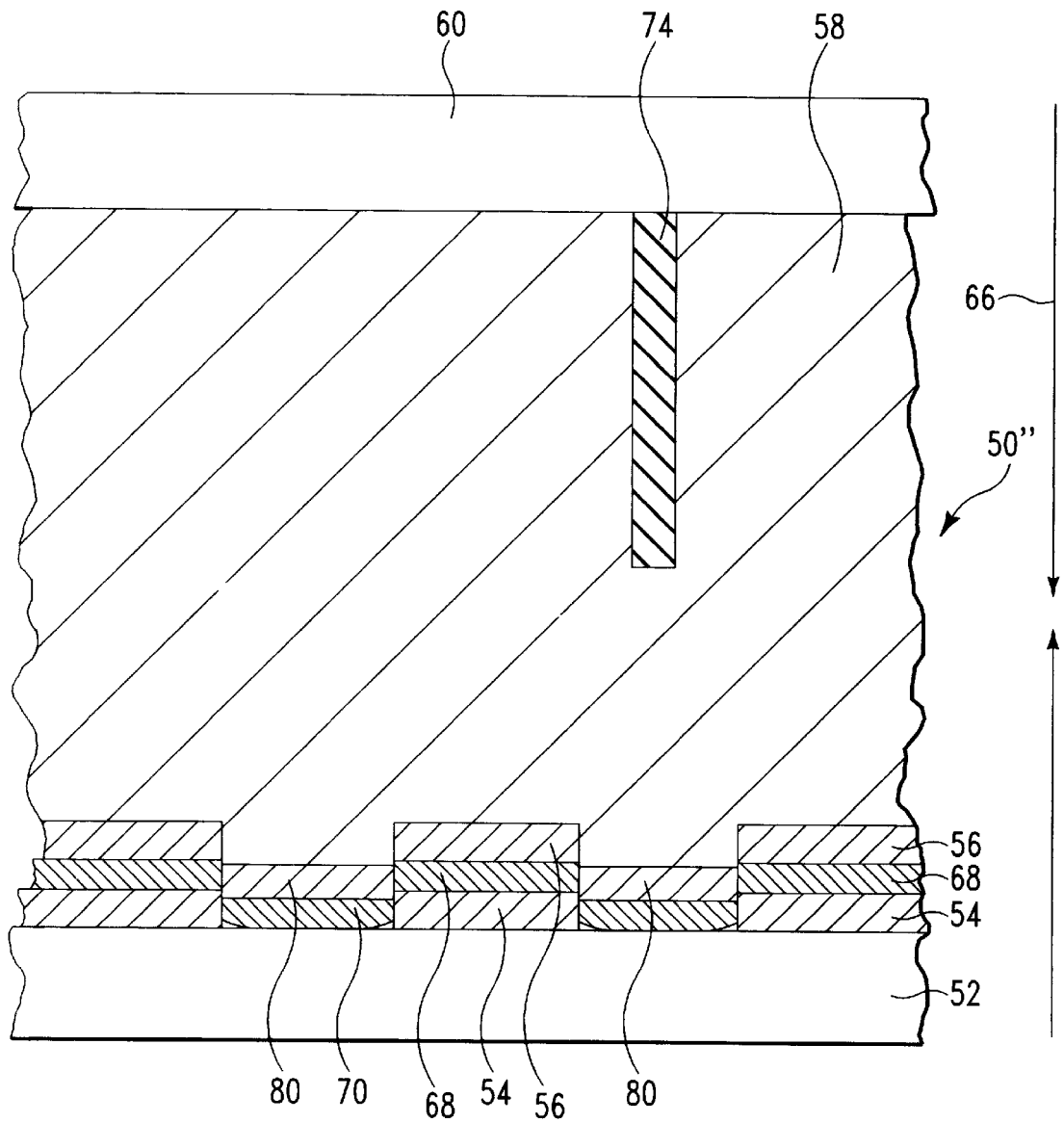

FIGS. 6A and 6B illustrate a further embodiment of the present invention. The flex die punching apparatus 50" is identical to the flex die punching apparatus 50 of FIGS. 4A and 4B except that now flexible, extrudable platen 58 includes at least one feature 80 on the flexible, extrudable platen 58. As shown in FIGS. 6A and 6B, the feature 80 may be a metallic material but any hard, wear-resistant material should be sufficient for the purposes of the present invention. The feature 80 corresponds to the shape and position of the apertures 62, 64 of the first and second dies 54, 56, respectively. For example, if apertures 62, 64 were circular, feature 80 should be circular as well. As can be appreciated, feature 80 acts as a punch, driven by the flexible, extrudable platen 58, to remove portion 70 of the sheet workpiece 68. Feature 80 also is effective in forming clean, sharp apertures in sheet workpiece 68. Flexible, extrudable platen 58 in flex die punching apparatus 50" may also include a stiffening material 74 as discussed previously.

Figure 7A:
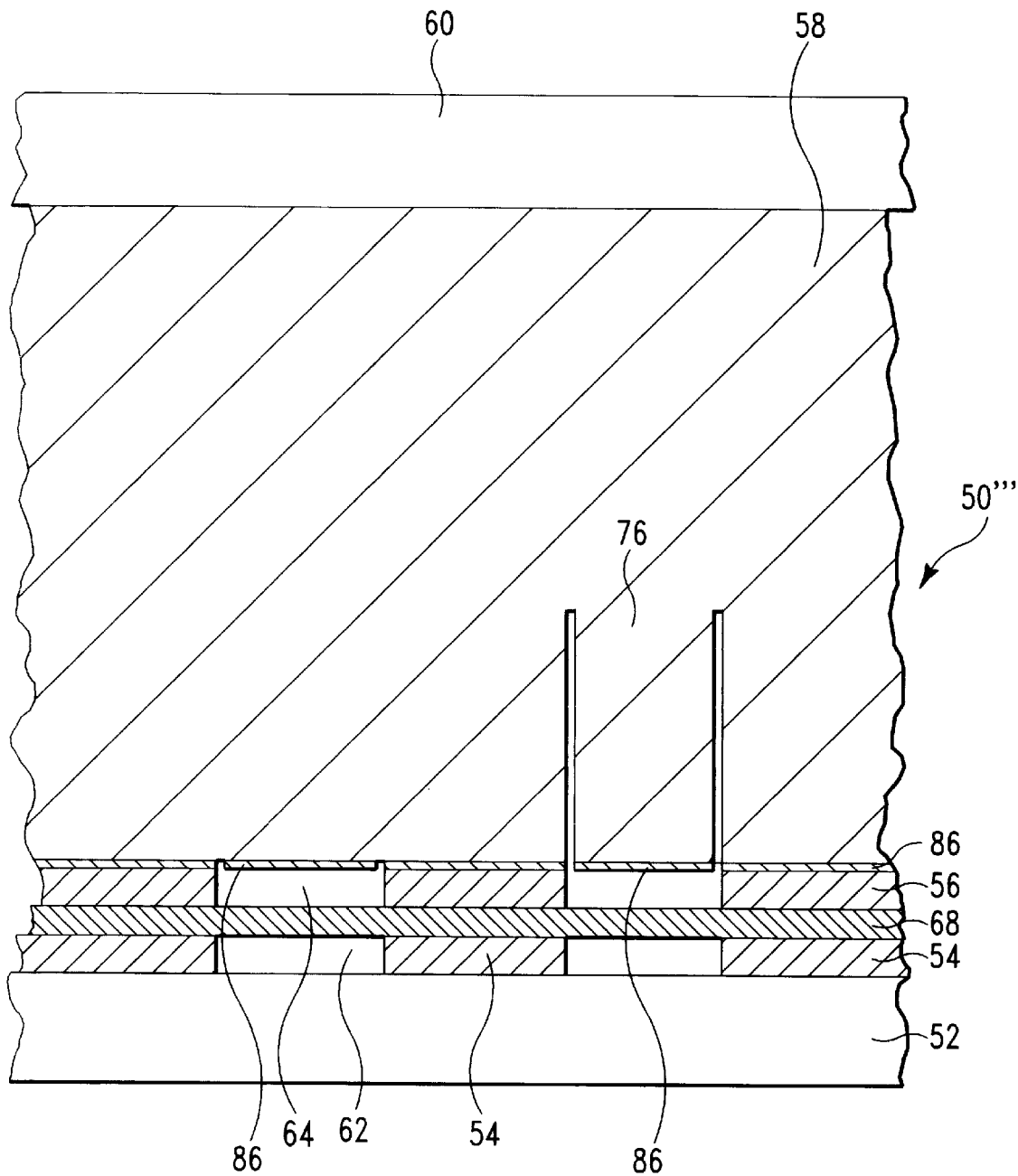
FIGS. 7A and 7B are schematical cross-sections of the apparatus according to the present invention showing a second die and further showing a thin, hard layer of material on the platen.
Figure 7B:
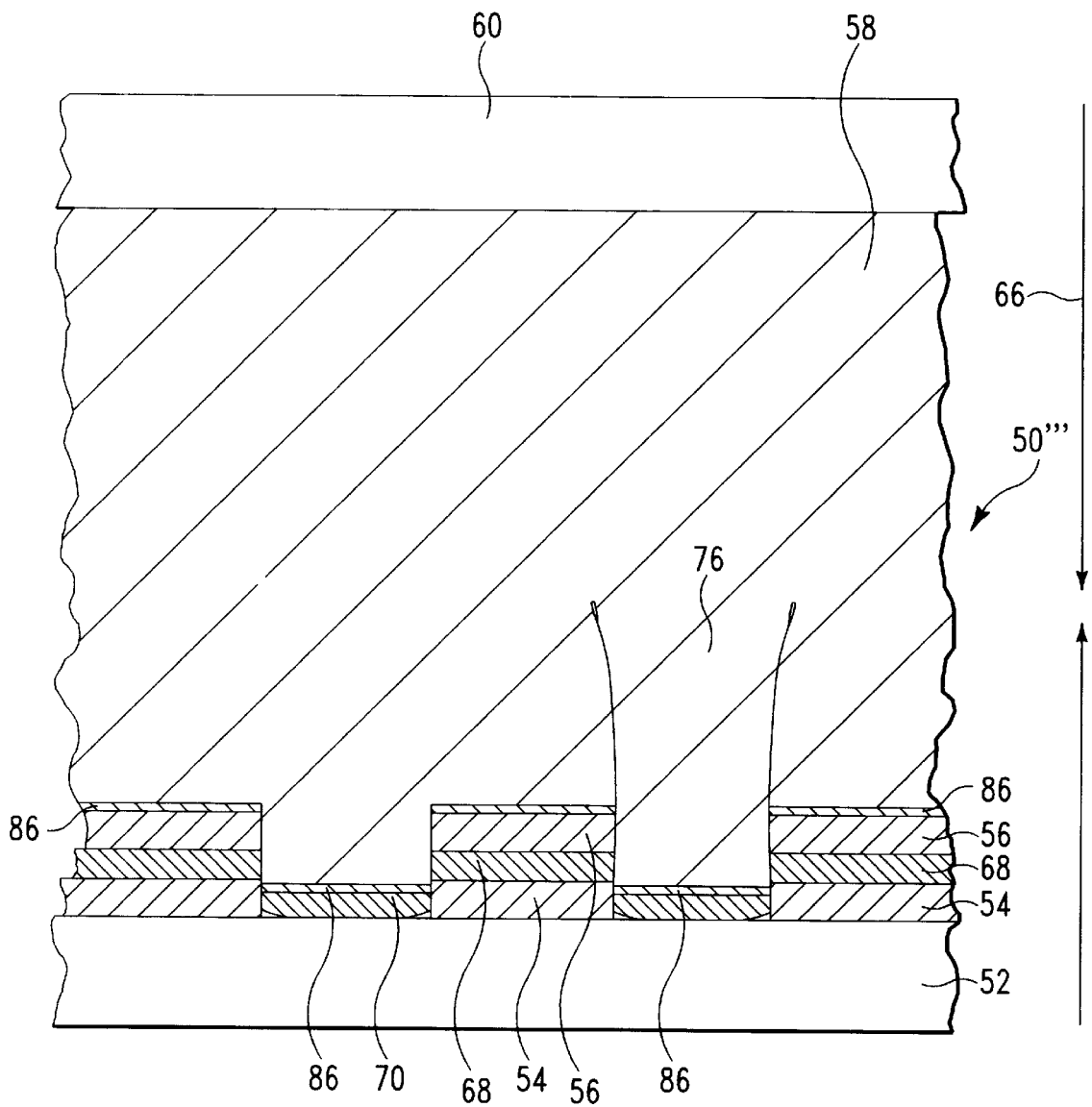

FIGS. 7A and 7B illustrate yet another embodiment of the present invention. The flex die punching apparatus 50''' is identical to the flex die punching apparatus 50 of FIGS. 4A and 4B except that now flexible, extrudable platen 58 includes a thin, hard layer of material 86 on the surface of the flexible, extrudable platen 58 that faces the second die 56. As discussed previously with respect to the embodiment of FIGS. 2A and 2B, the thin, hard layer of material 86 is bonded to that part of the flexible, extrudable platen 58 that is adjacent to the second die 56 and is also bonded to the flexible, extrudable platen 58 that is adjacent to the apertures 64 of the second die 56. If the flexible, extrudable platen 58 also includes a punch feature 76, the thin, hard layer will also be bonded to the punch feature 76, as shown in FIGS. 7A and 7B.

While the sheet workpiece material has been stated to be a greensheet material, it should be understood that this material is only specified for purposes of illustration and not limitation. Other sheet workpiece materials that may be useful in the present invention are, for example, metals, plastics, and other nonmetallic materials.

The flexible, extrudable platen for use in the present invention may be made from any suitable elastic or resilient material. Preferred materials should be elastomeric, abrasion-resistant and have a thickness of $\frac{1}{16}$ to $\frac{1}{4}$ inch, preferably $\frac{1}{8}$ inch. Some of the preferred materials meeting these requirements are silicone elastomers. The most preferred material is 9255 series silicone rubber sold by the CHR Division of the Furon Co., New Haven, Conn.

The die material is not important to the present invention so long as the material is somewhat wear-resistant, machinable and sufficiently robust to withstand the rigors of punching. Suitable materials include most thin, flexible sheet metals. Stainless steel sheet metals, for example, are desirable. Structural ceramics are also useful in the present invention. The apertures in the die material may be cut using any kind of machining method. Particularly preferred is the laser drilling method disclosed in the above LaPlante U.S. Pat. No. 5,168,454. The die aperture may be any shape desired, for example, circular, square, triangular, to name a few.

The stiffening material may be selected from any number of materials that would cause the stiffening material to be stiffer than the flexible, extrudable platen. Some of these stiffening materials may be, for example, metals, epoxies, plastics, ceramics, rubber etc.

As shown in the Figures, the stiffening material does not extend all the way through the flexible, extrudable platen. It is within the scope of the present invention for the stiffening material to extend all the way through the flexible, extrudable platen. It is also within the scope of the present invention for the flexible, extrudable platen to be porous, and preferably for the pores to run continuously through the thickness of the flexible, extrudable platen so that it takes on the appearance of swiss cheese. Then, the pores can be selectively filled with a stiffer or harder material to enhance the operation of the apparatus according to the present invention. It should be understood that the stiffening material need only be stiffer than the surrounding flexible, extrudable platen. Thus, the flexible, extrudable platen may be made from a relatively soft rubber while the stiffening material is made from a relatively hard rubber. It is also possible for the flexible, extrudable platen to be made from a porous material, like foam rubber, and then have the pores of the foam rubber selectively filled with epoxy or other stiff material.

The shape of the punch feature should be the same as the shape of the die aperture. Thus, the shape of the punch feature may also be any shape desired, for example, circular, square, triangular, to name a few.

Figure 8A:
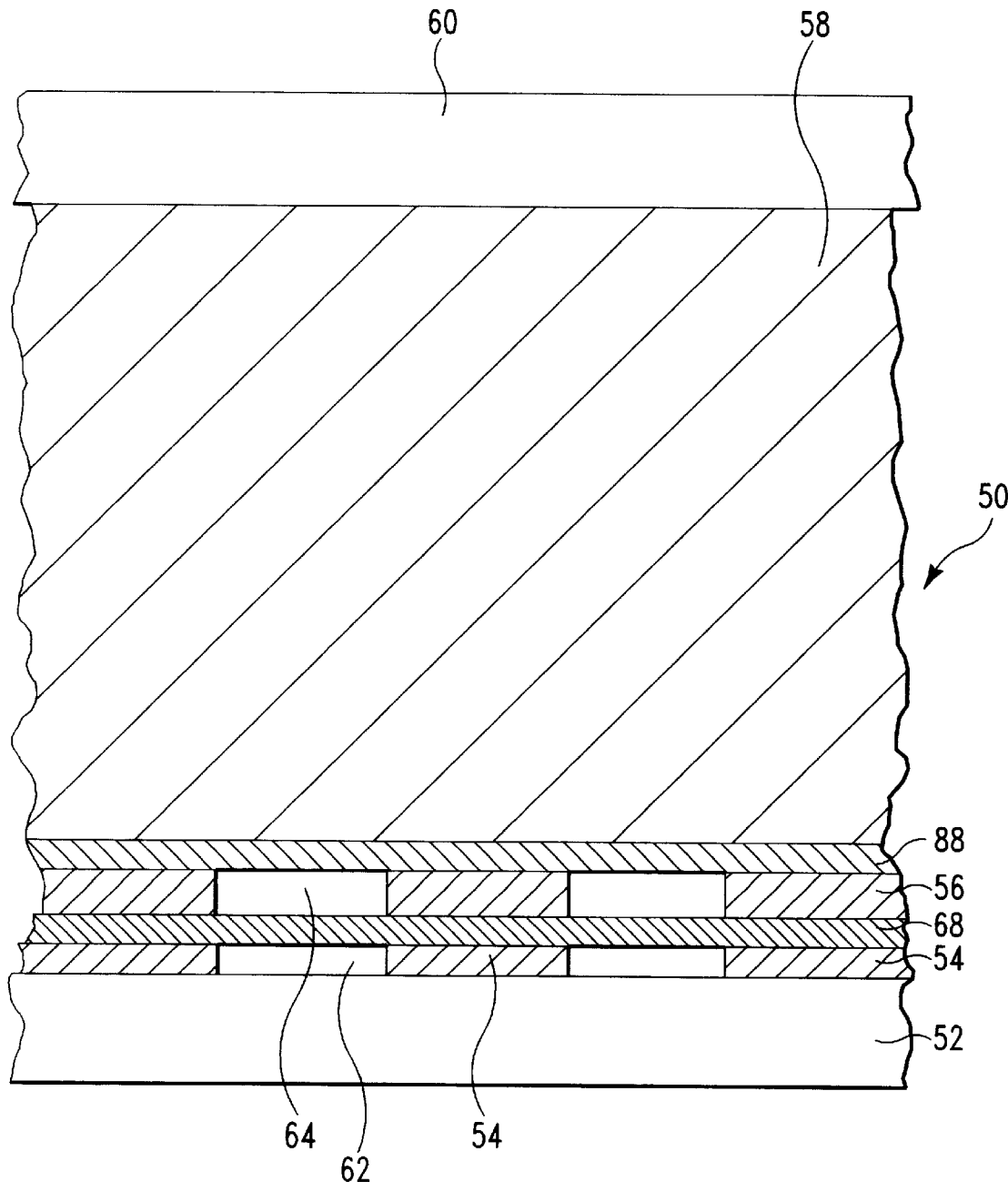
FIGS. 8A and 8B are schematical cross-sections of the apparatus according to the present invention showing a second die and further showing transfer punching of one sheet material into a second sheet material.
Figure 8B:
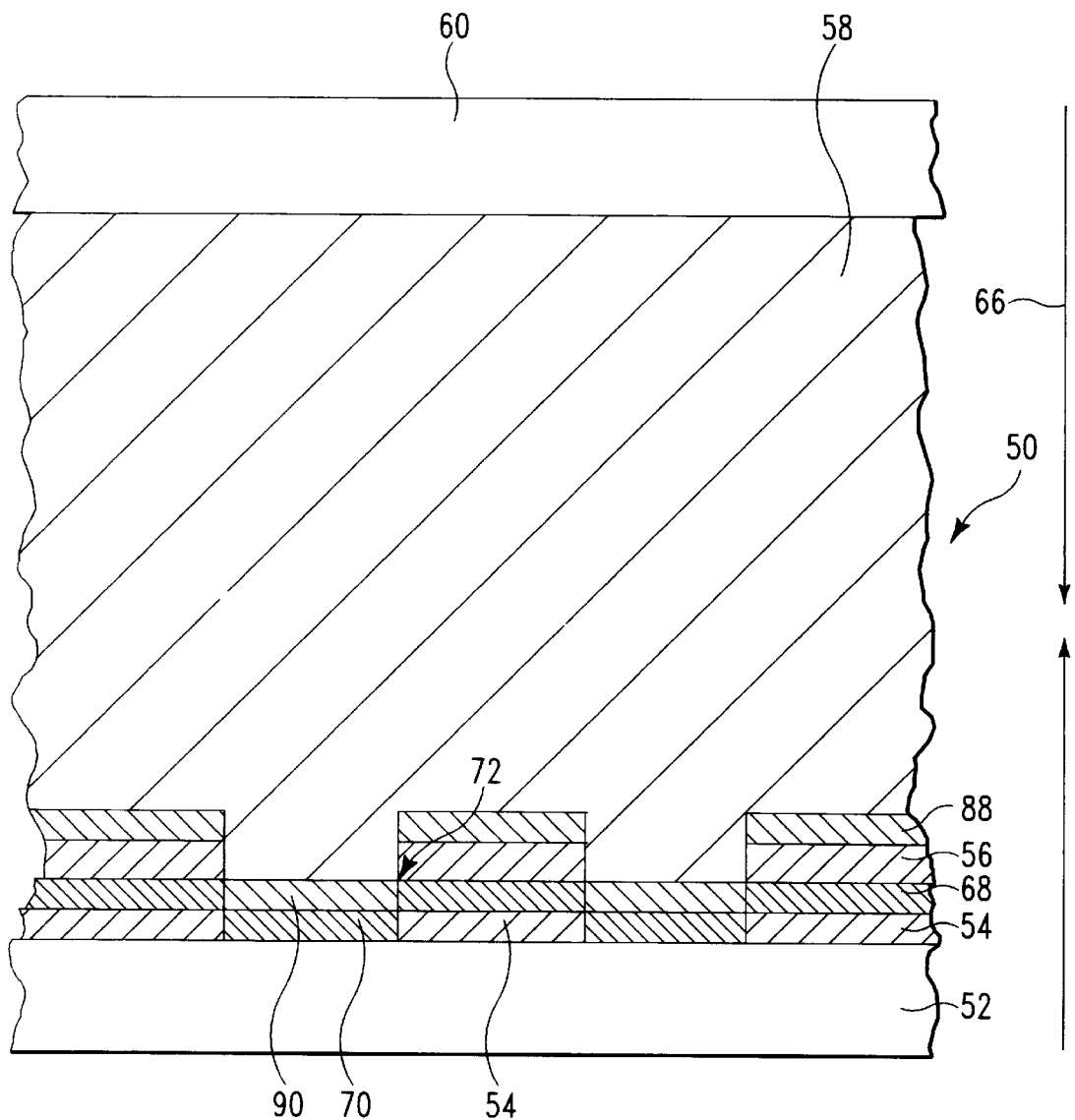

The operation of the present invention may be varied so as to simultaneously punch at least a second sheet workpiece 88. The flex die punching apparatus 50 as shown in FIGS. 8A and 8B is identical to the flex die punching apparatus 50 of FIGS. 4A and 4B. However, the dimension of first die 54 has been modified so that its thickness is the same as that of sheet workpiece 68. The reason for this will become apparent hereafter. In operation, sheet workpiece 68 is placed between the first die 54 and the second die 56, as before. Now, however, there is a second sheet workpiece (i.e., sheet workpiece 88) added to the apparatus which is positioned between second die 56 and flexible, extrudable platen 58. When force 66 is applied, flexible, extrudable platen 58 will cause at least a portion 90 of sheet workpiece 88 to be extruded into sheet workpiece 68, thereby displacing portion 70 of sheet workpiece 68. The aperture 72 that would normally be present in sheet workpiece 68 after punching is filled by portion 90 of sheet workpiece 88. In this manner, "transfer punching" of one material into a second material may be easily accomplished.

Alternatively, sheet workpiece 68 and second sheet workpiece 88 may both be placed between the first die 54 and the second die 56. Then, punching would take place as above described with respect to FIGS. 8A and 8B.

Figure 12A:
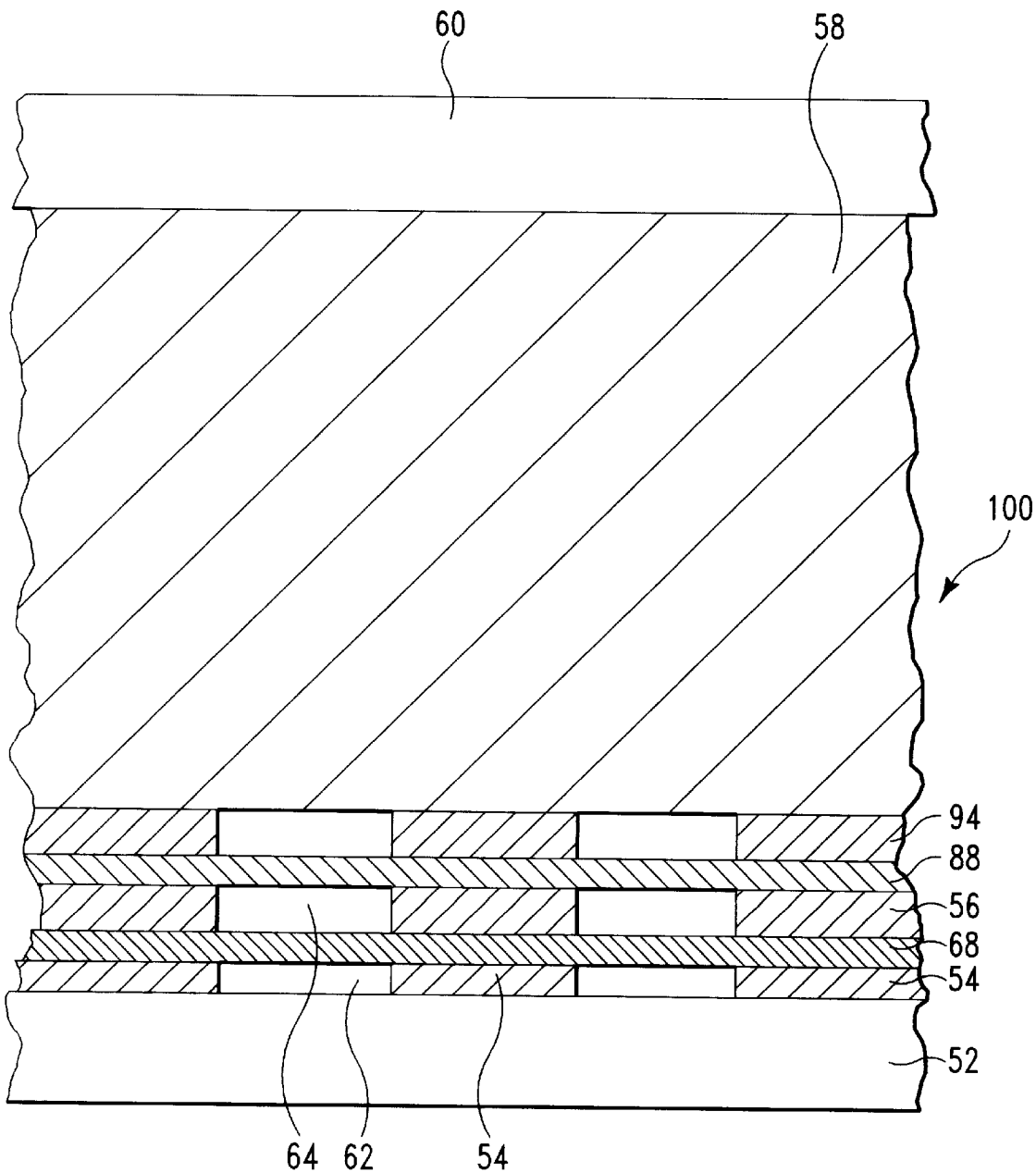
FIGS. 12A and 12B are schematical cross-sections of the apparatus according to the present invention showing a third die and further showing transfer punching of one sheet of material into a second sheet of material.
Figure 12B:
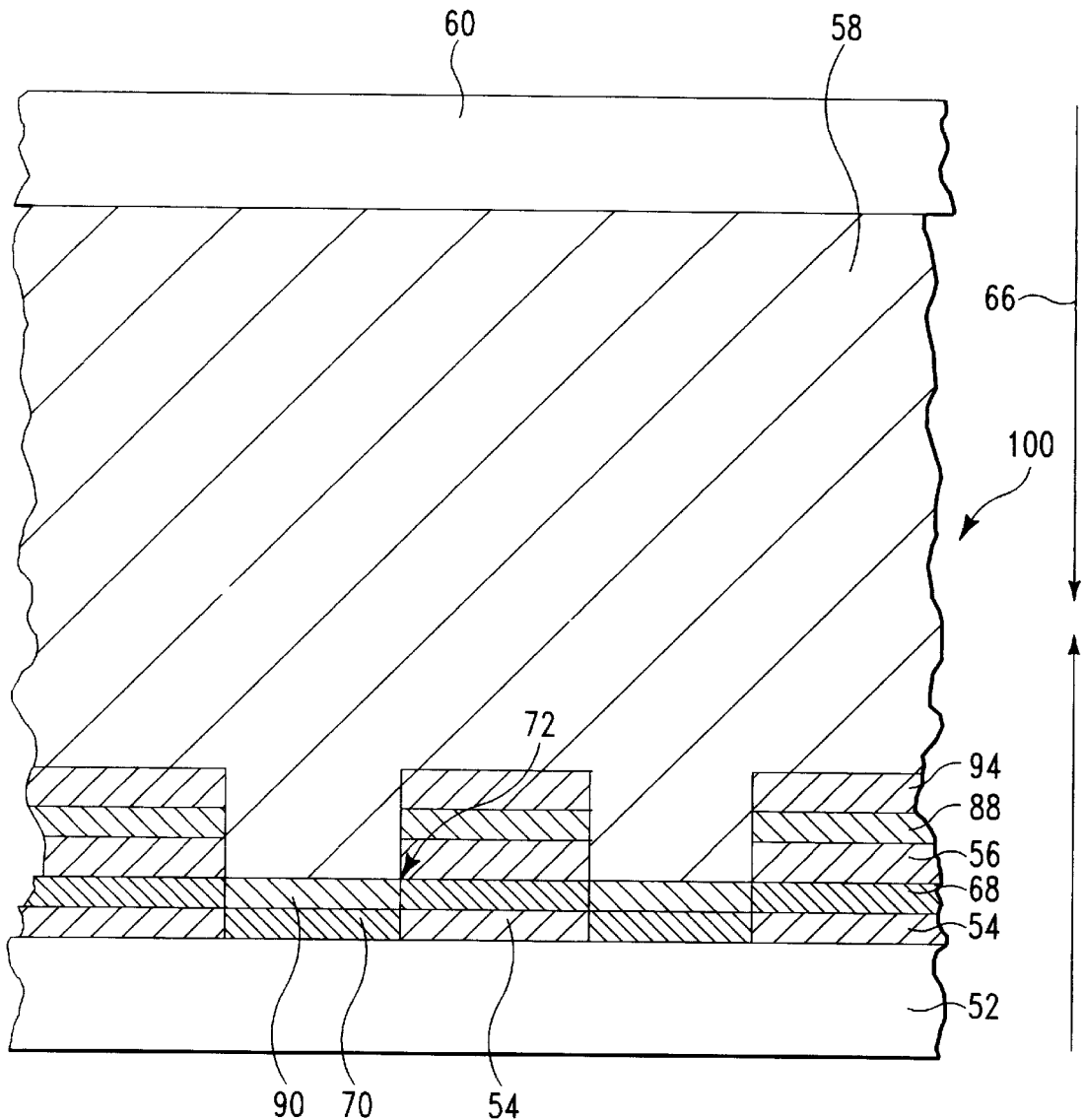

FIGS. 12A and 12B illustrate a final embodiment of the present invention. The embodiment of the flex die punching apparatus 100 is identical to flex die punching apparatus 50 except that there is now the addition of third die 94. In operation, flex die punching apparatus 100 works similarly to flex die punching apparatus 50 as illustrated in FIGS. 8A and 8B except that now, second sheet workpiece 88 is placed between second die 56 and third die 94. Transfer punching is accomplished in a similar manner with the added benefit that portion 90 is more precisely formed. Too, the addition of the third die 94 allows thicker sheet workpieces to be punched with precision.

Lastly, while all the embodiments of the invention have been shown with the orientation of the apparatus as shown in the Figures, the apparatus can also work when rotated to a different orientation, for example, 180 degrees from its present orientation.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A flex die punching apparatus comprising:
   a first plate;
   a die having at least one aperture positioned adjacent to the first plate, the aperture having a shape, a size and a position with respect to the die;
   a flexible, extrudable platen positioned adjacent to the at least one aperture of the die and adjacent to at least a portion of the remainder of the die, the flexible, extrudable platen having at least one punch feature corresponding to the shape, size and position of the at least one aperture of the die, there being but one punch feature for each aperature; and
   a second plate positioned adjacent to the flexible, extrudable platen;
   wherein, in operation, when at least one sheet workpiece is interposed between the flexible, extrudable platen and the die and then the first and second plates are forced together, the at least one punch feature of the flexible, extrudable platen is caused to move towards the first plate and through the at least one aperture of the die so as to extrude a portion of the at least one sheet workpiece through the at least one aperture of the die, thereby forming at least one aperture in the at least one sheet workpiece corresponding to the shape and position of the at least one aperture of the die.

2. The flex die punching apparatus of claim 1 further comprising a thin, hard layer of material bonded to the flexible, extrudable platen that is adjacent the die and is bonded to the at least one feature.

3. The flex die punching apparatus of claim 2 wherein the thin, hard layer of material is selected from the group consisting of ceramics, metals and composites.

4. The flex die punching apparatus of claim 1 wherein the at least one punch feature of the flexible, extrudable platen is situated within the flexible, extrudable platen and comprises partial perforation of the flexible, extrudable platen so as to define a periphery of the at least one punch feature.

5. The flex die punching apparatus of claim 1 wherein the die comprises thin, flexible sheet metal.

6. The flex die punching apparatus of claim 1 wherein the flexible, extrudable platen comprises a rubber.

7. The flex die punching apparatus of claim 1 further comprising a stiffening material inserted into the at least one punch feature of the flexible, extrudable platen, the stiffening material being stiffer than the flexible, extrudable platen.

8. The flex die punching apparatus of claim 7 wherein the stiffening material is selected from the group consisting of metals, epoxies, plastics, ceramics and rubbers.

9. A flex die punching apparatus comprising:
   a first plate;
   a first die having at least one aperture positioned adjacent to the first plate, the aperture having a shape, a size and a position with respect to the die;
   a second die having at least one aperture positioned adjacent to the first die, the aperture having a shape, a size and a position with respect to the die, the at least one apertures in the first and second dies being in alignment;
   a flexible, extrudable platen positioned adjacent to the at least one aperture of the second die and adjacent to at least a portion of the remainder of the second die, the flexible, extrudable platen having at least one punch feature corresponding to the shape, size and position of the at least one apertures of the first and second dies, there being but one punch feature for each corresponding pair of at least one apertures in the first and second dies; and
   a second plate positioned adjacent to the flexible, extrudable platen;
   wherein, in operation, when at least one sheet workpiece is interposed between the first and second dies and then the first and second plates are forced together, the at least one punch feature of the flexible, extrudable platen is caused to extrude a portion of the at least one sheet workpiece through the at least one aperture of the first die, thereby forming at least one aperture in the at least one sheet workpiece corresponding to the shape and position of the at least one apertures of the first and second dies.

10. The flex die punching apparatus of claim 9 further comprising a thin, hard layer of material bonded to the flexible, extrudable platen that faces the second die and is bonded to the at least one punch feature.

11. The flex die punching apparatus of claim 11 wherein the thin, hard layer of material is selected from the group consisting of ceramics, metals and composites.

12. The flex die punching apparatus of claim 9 wherein the at least one punch feature of the flexible, extrudable platen comprises partial perforation of the flexible, extrudable platen around the circumference of the at least one punch feature.

13. The flex die punching apparatus of claim 9 wherein the first and second dies comprise thin, flexible sheet metal.

14. The flex die punching apparatus of claim 9 wherein the flexible, extrudable platen comprises a rubber.

15. The flex die punching apparatus of claim 9 further comprising a stiffening material inserted into the at least one punch feature of the flexible, extrudable platen, the stiffening material being stiffer than the flexible, extrudable platen.

16. The flex die punching apparatus of claim 15 wherein the stiffening material is selected from the group consisting of metals, epoxies, plastics, ceramics and rubbers.

17. The flex die punching apparatus of claim 9 further comprising a stiffening material inserted into the flexible, extrudable platen and adjacent to the at least one punch feature of the flexible, extrudable platen, the stiffening material being stiffer than the flexible, extrudable platen.

18. The flex die punching apparatus of claim 17 wherein the stiffening material is selected from the group consisting of metals, epoxies, plastics, ceramics and rubbers.

* * * * *